United States Patent
Briggs et al.

(10) Patent No.: US 11,756,786 B2
(45) Date of Patent: Sep. 12, 2023

(54) FORMING HIGH CARBON CONTENT FLOWABLE DIELECTRIC FILM WITH LOW PROCESSING DAMAGE

(71) Applicant: International Business Machines Corporation, Armonk, NY (US)

(72) Inventors: Benjamin D. Briggs, Waterford, NY (US); Donald F. Canaperi, Bridgewater, CT (US); Huy Cao, Rexford, NY (US); Thomas J. Haigh, Jr., Claverack, NY (US); Son Nguyen, Schenectady, NY (US); Hosadurga Shobha, Niskayuna, NY (US); Devika Sil, Rensselaer, NY (US); Han You, Plano, TX (US)

(73) Assignee: International Business Machines Corporation, Armonk, NY (US)

( * ) Notice: Subject to any disclaimer, the term of this patent is extended or adjusted under 35 U.S.C. 154(b) by 457 days.

(21) Appl. No.: 16/251,526

(22) Filed: Jan. 18, 2019

(65) Prior Publication Data
US 2020/0234949 A1    Jul. 23, 2020

(51) Int. Cl.
*H01L 21/02*    (2006.01)
*C23C 16/30*    (2006.01)
(Continued)

(52) U.S. Cl.
CPC .......... *H01L 21/02208* (2013.01); *B05D 1/60* (2013.01); *B05D 3/029* (2013.01);
(Continued)

(58) Field of Classification Search
CPC . C23C 14/0652; C23C 14/0682; C23C 14/08; C23C 14/10; C23C 14/12;
(Continued)

(56) References Cited

U.S. PATENT DOCUMENTS 6,566,278 B1    5/2003    Harvey et al.
6,740,539 B2    5/2004    Conti et al.
(Continued)

FOREIGN PATENT DOCUMENTS

CN    1698188 A    11/2005
CN    102437143 A    5/2012
(Continued)

OTHER PUBLICATIONS

Richard J. Lewis, Sr., editor; Hawley's Condensed Chemical Dictionary, 12th edition; Van Nostrand Reinhold Company, New York; 1993 (no month); excerpt pp. 230-232.*
(Continued)

*Primary Examiner* — Michael P Wieczorek
(74) *Attorney, Agent, or Firm* — Cantor Colburn LLP; Peter Edwards

(57) ABSTRACT

A method of fabricating a dielectric film includes depositing a first precursor on a substrate. The first precursor includes a cyclic carbosiloxane group comprising a six-membered ring. The method also includes depositing a second precursor on the substrate. The first precursor and the second precursor form a preliminary film on the substrate, and the second precursor includes silicon, carbon, and hydrogen. The method further includes exposing the preliminary film to energy from an energy source to form a porous dielectric film.

14 Claims, 11 Drawing Sheets

(51) Int. Cl.
  *C23C 16/56* (2006.01)
  *H01L 21/768* (2006.01)
  *C23C 16/48* (2006.01)
  *B05D 1/00* (2006.01)
  *B05D 3/06* (2006.01)
  *B05D 3/02* (2006.01)

(52) U.S. Cl.
  CPC ............... *B05D 3/06* (2013.01); *B05D 3/067* (2013.01); *B05D 3/068* (2013.01); *C23C 16/30* (2013.01); *C23C 16/48* (2013.01); *C23C 16/56* (2013.01); *H01L 21/02126* (2013.01); *H01L 21/02203* (2013.01); *H01L 21/02348* (2013.01); *H01L 21/76822* (2013.01)

(58) Field of Classification Search
  CPC ......... C23C 14/58–5833; C23C 14/5846–586; C23C 16/30; C23C 16/308; C23C 16/325; C23C 16/345; C23C 16/36; C23C 16/401–402; C23C 16/48–487; C23C 16/56; H01L 21/02126; H01L 21/0214; H01L 21/02203; H01L 21/02208–02222; H01L 21/02247; H01L 21/02249; H01L 21/02329; H01L 21/02332; H01L 21/02345; H01L 21/02348; H01L 21/76822; H01L 21/76825; H01L 21/76828; B05D 1/60; B05D 3/067; B05D 3/068; B05D 3/108; B05D 3/147; B05D 3/029; B05D 3/06
  USPC ....... 427/493, 497, 503, 504, 509, 510, 515, 427/551–555, 557, 558
  See application file for complete search history.

(56) References Cited

U.S. PATENT DOCUMENTS

| | | | |
|---|---|---|---|
| 6,936,551 B2 * | 8/2005 | Moghadam | H01L 21/0206 438/780 |
| 7,271,700 B2 | 9/2007 | Chinthakindi et al. | |
| 7,479,306 B2 * | 1/2009 | Edelstein | H01L 31/103 257/E31.057 |
| 7,622,369 B1 | 11/2009 | Lee et al. | |
| 7,737,052 B2 | 1/2010 | Bhatia et al. | |
| 7,737,525 B1 | 6/2010 | Wu et al. | |
| 7,803,722 B2 | 9/2010 | Liang | |
| 8,318,584 B2 | 11/2012 | Li et al. | |
| 8,449,942 B2 | 5/2013 | Liang et al. | |
| 8,637,412 B2 | 1/2014 | Grill et al. | |
| 8,846,536 B2 | 9/2014 | Draeger et al. | |
| 8,980,382 B2 | 3/2015 | Ingle et al. | |
| 9,209,017 B2 * | 12/2015 | Canaperi | H01L 21/0234 |
| 9,299,559 B2 | 3/2016 | Draeger et al. | |
| 9,343,293 B2 | 5/2016 | Underwood et al. | |
| 9,362,107 B2 * | 6/2016 | Thadani | H01L 21/02337 |
| 9,721,892 B2 * | 8/2017 | Zhou | H01L 23/5329 |
| 9,887,080 B2 | 2/2018 | Moon et al. | |
| 2003/0232137 A1 * | 12/2003 | Vrtis | H01L 21/02274 427/248.1 |
| 2003/0232495 A1 * | 12/2003 | Moghadam | H01L 21/0277 438/623 |
| 2004/0130032 A1 | 7/2004 | Gronbeck et al. | |
| 2004/0197474 A1 * | 10/2004 | Vrtis | C23C 16/56 427/255.28 |
| 2007/0173071 A1 | 7/2007 | Afzali-Ardakani et al. | |
| 2007/0299239 A1 | 12/2007 | Weigel et al. | |
| 2008/0009141 A1 * | 1/2008 | Dubois | H01L 21/76834 438/758 |
| 2010/0061915 A1 | 3/2010 | Hamada | |
| 2011/0272813 A1 | 11/2011 | Kume et al. | |
| 2013/0260575 A1 * | 10/2013 | Al-Rashid | H01L 21/02211 438/789 |
| 2015/0279667 A1 * | 10/2015 | Canaperi | H01L 21/02274 106/122 |
| 2016/0017492 A1 | 1/2016 | Xie et al. | |
| 2017/0117225 A1 | 4/2017 | Adusumilli et al. | |
| 2018/0023192 A1 | 1/2018 | Chandra et al. | |

FOREIGN PATENT DOCUMENTS

| | | |
|---|---|---|
| JP | 2005524983 A | 8/2005 |
| JP | 2007194639 A | 8/2007 |
| JP | 2008530820 A | 8/2008 |
| JP | 2010067810 A | 3/2010 |
| JP | 2011238704 A | 11/2011 |
| JP | 2018182077 A | 11/2018 |

OTHER PUBLICATIONS

Ralf Riedel and I-Wei Chen; Ceramics Science and Technology, vol. 4: Applications; Excerpt of sections 7.2.1-7.2.2, part of 7.2.5 & probably part of 7.2.4; no publication date available, but a retrieval date of May 7, 2019 (location of retrieval unspecified).*
Notification of Transmittal of the International Search Report and the Written Opinion of the International Searching Authority, or the Declaration; PCT/IB2019/060709; dated Apr. 8, 2020; pp. 1-9.
Japanese Office Action; dated Jun. 16, 2023; Application No. 2021-540574; Filed: Dec. 12, 2019; 6 pages.
United Kingdom Examination Report under Section 18(3) dated Jun. 21, 2022, Application No. GB2110858.4, 3 pages.

* cited by examiner

FORMING HIGH CARBON CONTENT FLOWABLE DIELECTRIC FILM WITH LOW PROCESSING DAMAGE

BACKGROUND

The present invention generally relates to fabrication methods and resulting structures for semiconductor devices. More specifically, the present invention relates to fabrication methods and resulting structures for high carbon content flowable dielectric films formed with low processing damage.

Integrated circuits in electronic devices involve semiconductor device fabrication. A sequence of photolithographic and chemical processing steps creates the electronic circuits on a semiconducting wafer. The semiconducting wafers are subjected to front-end-of-line (FEOL) processing and back-end-of-line (BEOL) processing. FEOL processing includes forming transistors directly in the silicon. BEOL processing includes interconnecting the respective semiconductor devices to form the electrical circuits. In particular, interconnecting metal wires isolated by insulating layers are created. The insulating dielectric material is, for example, silicon dioxide or low dielectric constant (k) materials.

SUMMARY

Embodiments of the present invention are directed to a method for fabricating a dielectric film. A non-limiting example of the method includes depositing a first precursor on a substrate. The first precursor includes a cyclic carbosiloxane group comprising a six-membered ring. The method also includes depositing a second precursor on the substrate. The first precursor and the second precursor form a preliminary film on the substrate, and the second precursor includes silicon, carbon, and hydrogen. The method further includes exposing the preliminary film to energy from an energy source to form a porous dielectric film. Advantages of the method includes providing a smaller pore size than the eight-membered ring carbosiloxane counterparts, which lowers the k value and provides a lower capacitance.

Another non-limiting example of the method includes depositing a first precursor on a substrate. The first precursor has the following structure:

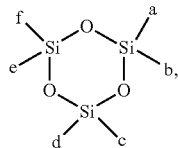

and
a, b, c, d, e, and f are each independently an alkyl group or an alkenyl group. The method also includes depositing a second precursor on the substrate. The first precursor and the second precursor form a preliminary film on the substrate, and the second precursor includes a linear carbosiloxane. The method further includes exposing the preliminary film to an energy source to form a porous dielectric film. Advantages of the method includes a smaller pore size than the eight-membered ring carbosiloxane counterparts, which lowers the k value and provides a lower capacitance.

Another non-limiting example of the method includes depositing a first precursor on a substrate. The first precursor includes a cyclic carbosiloxane group. The method also includes depositing a second precursor on the substrate. The first precursor and the second precursor form a preliminary film on the substrate, and the second precursor includes a carbosilane with a carbon to silicon ratio greater than 3:1. The method further includes exposing the preliminary film to an energy source to form a porous dielectric film. Advantages of method includes an enriched carbon content and smaller pore size and thus strong and stable bonding within the film, which provides improved mechanical properties (e.g., density) and a reduced susceptibility to processing damage, such as by etching and planarization.

Embodiments of the present invention are directed to a dielectric film. A non-limiting example of the dielectric film includes a covalently bonded network including atoms of silicon, oxygen, carbon, and hydrogen. The dielectric film also includes a cyclic carbosiloxane group and a bridging Si—$CH_2$—Si group. Advantages of dielectric film includes an enriched carbon content and smaller pore size and thus strong and stable bonding within the film, which provides improved mechanical properties (e.g., density) and a reduced susceptibility to processing damage, such as by etching and planarization.

Another non-limiting example of the dielectric film includes a covalently bonded network including atoms of silicon, oxygen, carbon, hydrogen, and nitrogen. The dielectric film also includes a cyclic carbosiloxane group and a bridging Si—$CH_2$—Si group. Advantages of dielectric film includes an enriched carbon content and smaller pore size and thus strong and stable bonding within the film, which provides improved mechanical properties (e.g., density) and a reduced susceptibility to processing damage, such as by etching and planarization.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-6 depict a process flow for fabricating a dielectric film in a semiconductor device according to embodiments of the present invention, in which:

FIG. 1 depicts a cross-sectional side view of a patterned substrate of the semiconductor device;

FIG. 2 depicts a cross-sectional side view of the patterned substrate subsequent to flowing a first precursor and a second precursor onto the patterned substrate;

FIG. 3 depicts a cross-sectional side view of the patterned substrate subsequent to forming a preliminary dielectric film on the patterned substrate;

FIG. 4 depicts a cross-sectional side view of the patterned substrate subsequent to exposing the preliminary dielectric film to a nitrogen-containing precursor;

FIG. 5 depicts a cross-sectional side view of the patterned substrate subsequent to exposing the preliminary dielectric film to an energy source; and FIG. 6 depicts a cross-sectional side view of the porous dielectric film formed on the patterned substrate;

Figure 1:
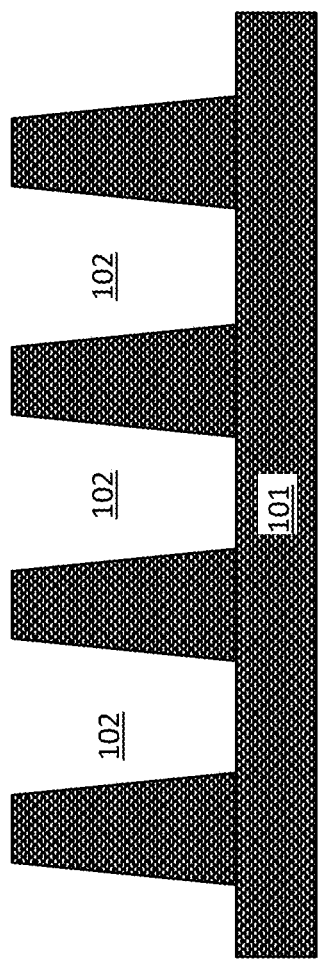

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, as line dimensions shrink to increase the speed and memory storage capability of microelectronic devices (e.g., computer chips), the insulating requirements become more rigorous. Reduced size and dimensions in these devices need a lower k material to minimize the RC time constant, where R is the resistance of the conductive line, C is the capacitance of the insulating dielectric interlayer, and C is inversely proportional to spacing and proportional to the k of the ILD.

Many of the fabrication steps of very large scale integration (VLSI) and ultra-large scale integration (VLSI) chips are carried out by plasma enhanced chemical or physical vapor deposition techniques. The ability to fabricate an ultra-low k material by plasma enhanced chemical vapor deposition (PECVD) technique using previously installed and available processing equipment thus simplifies manufacturing process integration, reduces manufacturing cost, and creates less hazardous waste.

Furthermore, as electronic devices decrease in size, the thicknesses of the dielectric insulator film layers decrease. As a result, the dielectric layers are subject to an increased propensity to degrade, or wear-out, known as time-dependent dielectric breakdown (TDDB).

Ultra-low k dielectric films including atoms of silicon (Si), carbon (C), oxygen (O), and hydrogen (H) (SiCOH) can be non-porous or porous. Generally, porous SiCOH films have a lower dielectric constant (k) (e.g., k less than or equal to 3.0) than the corresponding non-porous films. The k values of porous SiCOH films are typically about 1.8 to about 2.95, with lower k films having higher porosity. Porous films can be formed by, for example, introducing a labile porogen group during deposition of the preliminary film structure that is subsequently removed by curing.

Porous ultra-low k SiCOH films, however, can have sub-optimal mechanical properties compared to corresponding non-porous dielectrics, such as, for example, high fracturing velocity and stress, and low modulus and hardness. The SiCOH dielectric films also can deteriorate as the k decreases. As a result, many ultra-low k SiCOH films are susceptible to processing damage. For example, the carbon content in standard SiCOH films can be removed during patterning and etching processes (e.g., plasma reactive ion etching and oxygen based plasma ashing processes). As a result, the film can perform like porous silicon oxide and be quickly removed by standard wet etching, which can affect the dimensional control during patterning. Furthermore, the k value of porous silicon oxide readily absorbs moisture and has a much higher k value (e.g., k greater than 4.2). The porous oxide film will therefore increase the overall k value and final device capacitance and reliability. Plasma Induced Damage (PID) is a parameter that describes this type of degradation in a dielectric film.

Improved mechanical properties of low k or ultra-low k SiCOH dielectrics can be achieved by treating the SiCOH films post deposition. For example, curing or treatment using thermal, ultraviolet (UV) light, electron beam irradiation, chemical energy or a combination of these energy sources has been used to stabilize the low or ultra-low k dielectric material and to improve the mechanical properties of the same. While such post deposition treatments are possible, they add extra processing steps and thus cost to the manufacturing of low k or ultra-low k dielectric films. Accordingly, there is a need for an improved ultra-low k dielectric film material that is not susceptible to post-processing mechanical damage and can be used to fill in devices with reduced size and dimensions.

SiCOH films can be formed by using CVD processes that deposit precursors onto patterned regions of a substrate. Precursors used to form the films include, for example, cyclic and linear organosilicon compounds (e.g., cyclic siloxanes such as octamethylcyclotetrasiloxane [$(CH_3)_2SiO]_4$), and linear tetramethyl orthosilicate ($Si(OCH_3)_4$)). The precursors form a film that flows on the substrate during deposition to facilitate filling restricted geometries.

Although ultra-low k SiCOH films are desired, porous SiCOH films with lower k values can have sub-optimal mechanical properties compared to corresponding non-porous materials, such as, for example, high fracturing velocity and stress, and low modulus and hardness. Accordingly, these ultra-low k films are susceptible to processing damage, such from chemical mechanical planarization (CMP). Accordingly, there is a need for an improved ultra-low k dielectric film material that is not susceptible to post-processing mechanical damage and can be used to fill in devices with reduced size and dimensions.

Turning now to an overview of the aspects of the invention, one or more embodiments of the invention address the above-described shortcomings of the prior art by providing methods for depositing and resulting low k dielectric films with a high carbon content (e.g., greater than 20%). Two precursors are used to form the dielectric films. The first precursor is a cyclic organosilicon compound that includes a cyclic carbosiloxane group with a six-membered ring of three silicon atoms alternating with three oxygen atoms, or an eight-membered ring of four silicon atoms alternating with four oxygen atoms. The first precursor includes a high carbon content. The second precursor is a high carbon content linear carbosiloxane or carbosilane. Compared to cyclic precursors with four silicon atoms (e.g., octamethyl-cyclotetrasiloxane), cyclic carbosiloxane precursors of six-membered rings have a higher carbon content. In some embodiments of the present invention, the ratio of C:Si is greater than 4:1, and the ratio of C:O is greater than 1. Once the first and second precursors are deposited on the patterned substrate, the preliminary film can be exposed to a nitrogen containing precursor (e.g., ammonia ($NH_3$)), to form a nitrogen-containing SiCONH film, as well as to reduce film shrinkage. The preliminary film is cured to form the final porous film.

The above-described aspects of the invention address the shortcomings of the prior art by providing flowable, porous SiCOH and SiCONH films with high carbon contents and low k values (e.g., less than 3.0 according to one or more embodiments of the present invention). The cyclic carbosi-loxanes with three silicon atoms provide a smaller pore size than their four silicon atom counterparts, which provides a reduced pore size that lowers the k value and provides a lower capacitance. Due to the combination of higher carbon content and smaller pore size and thus strong and stable bonding within the film, the films have improved mechanical properties (e.g., density) and a reduced susceptibility to processing damage, such as by etching and planarization. The films also have improved conformal coverage for filling small gaps in patterned substrates.

Turning now to a more detailed description of aspects of the present invention, FIGS. 1-6 depict a process flow for forming a dielectric film on a patterned substrate 101 including one or more trenches 102 according to embodiments of the present invention. FIG. 1 depicts a cross-sectional side view of the patterned substrate 101. The patterned substrate 101 includes a single layer or a multi-layer material, including, but not limited to, a semi-conducting material, an insulating material, a conducting material, or any combination thereof. Non-limiting examples of semiconducting materials include Si, SiGe, SiGeC, SiC, GaAs, InAs, InP and other III/V or II/VI compound semiconductors. The patterned substrate 101 can also include a layered substrate such as, for example, Si/SiGe, Si/SiC, silicon-on-insulators (SOIs) or silicon germanium-on-insulators (SGOIs).

When patterned substrate 101 includes an insulating material, the insulating material can be an organic insulator, an inorganic insulator or a combination thereof, including multilayers. When the patterned substrate 101 includes a conducting material, the patterned substrate 101 can include, for example, polysilicon, an elemental metal, alloys of elemental metals, a metal silicide, a metal nitride and combinations thereof, including multilayers. The patterned substrate 101 can include a combination of a semiconducting material and an insulating material, a combination of a semiconducting material and a conductive material or a combination of a semiconducting material, an insulating material, and a conductive material.

The one or more trenches 102 (or gaps) in the patterned substrate 101 are formed by, for example etching. When viewed from the surface, the trenches 102 can have any shape or dimension. The trenches 102 can be circular, oval, polygonal, rectangular, or a variety of other shapes. The trenches 102 have a height and width that define an aspect ratio of the height to the width that is greater than 1:1 (e.g., 5:1 or more, 6:1 or more, 7:1 or more, 8:1 or more, 9:1 or more, 10:1 or more, 11:1 or more, 12:1 or more, etc.). In some embodiments of the present invention, the high aspect ratio is due to small gap widths less than 32 nanometers (nm), less than 28 nm, less than 22 nm, or less than 16 nm. Although FIGS. 1-6 illustrate embodiments of a patterned substrate 101, according to other embodiments the substrate is not patterned. The films described herein can be deposited onto any substrate having any surface topology, including one that is flat or substantially flat.

Figure 2:
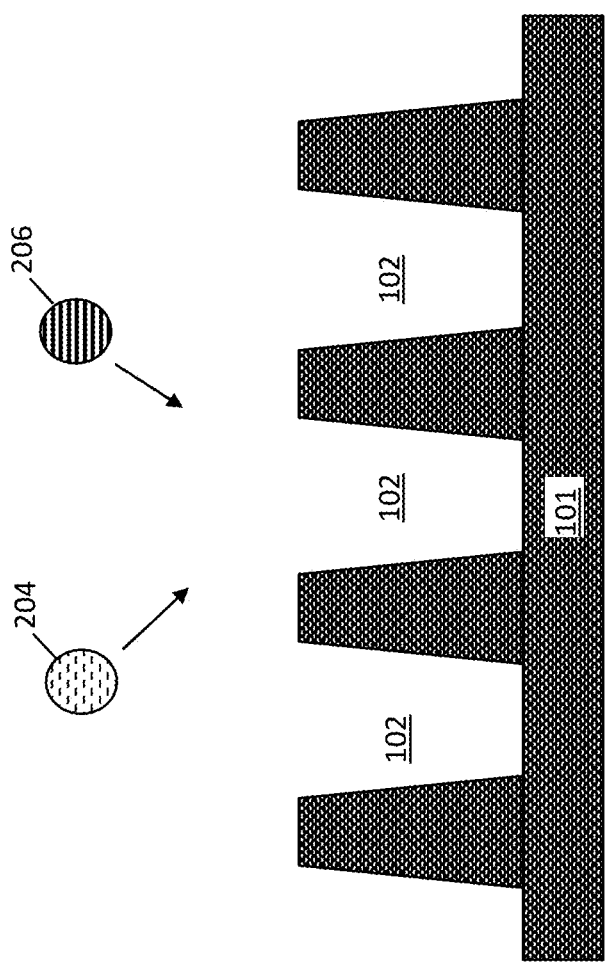

FIG. 2 depicts a cross-sectional side view of the patterned substrate 101 subsequent to flowing a first precursor 204 and a second precursor 206 onto the surface of the patterned substrate 101. The patterned substrate 101 is placed in a reactor chamber. Then, the first precursor 204 and second precursor 206, which can be in the form of a liquid, gas, or vapor, are introduced into the chamber. Any deposition method can be used, for example spin-on coating, plasma enhanced chemical vapor deposition (PECVD), thermal chemical vapor deposition, evaporation, or other methods.

The first precursor 204 is a cyclic carbosiloxane that includes atoms of silicon (Si), carbon (C), oxygen (O), and hydrogen (H). The first precursor 204 is a six-membered ring of three silicon atoms alternating with three oxygen atoms according to some embodiments of the present invention. The first precursor 204 is an eight-membered ring of four silicon atoms alternating with four oxygen atoms according to other embodiments of the present invention.

According to one or more embodiments of the present invention, the first precursor 204 has the following structure:

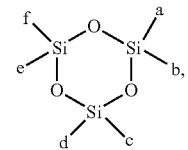

and a, b, c, d, e, and f are each independently an alkyl group or an alkenyl group. According to one or more embodiments of the present invention, the alkyl group is a methyl group, an ethyl group, a propyl group, a butyl group, or a pentyl group. According to some embodiments of the present invention, the alkenyl group is an ethenyl group, a propenyl group, a butenyl group, or a pentenyl group.

According to one or more embodiments of the present invention, the first precursor 204 has the following structure:

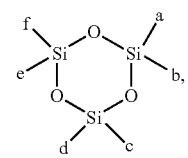

and a, c, and e are each a methyl group, and b, d, and f are each an ethenyl group.

According to some embodiments of the present invention, the first precursor 204 has the following structure:

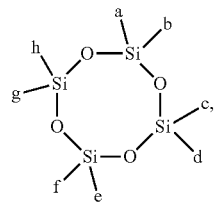

and
a, b, c, d, e, and f are each independently an alkyl group or an alkenyl group. According to one or more embodiments of the present invention, the alkyl group is a methyl group, an ethyl group, a propyl group, a butyl group, or a pentyl group. According to some embodiments of the present invention, the alkenyl group is an ethenyl group, a propenyl group, a butenyl group, or a pentenyl group.

In one or more embodiments of the present invention, the first precursor 204 has a carbon to silicon (C:Si) ratio that is greater than 2:1. According to other embodiments, the first precursor has a C:Si ratio that is about 3:1 to about 9:1.

The second precursor 206 is a linear carbosiloxane according to one or more embodiments of the present invention, and includes atoms of silicon (Si), carbon (C), oxygen (O), and hydrogen (H). The second precursor 206 is a carbosilane according to other embodiments of the present invention, and includes atoms of silicon (Si), carbon (C), and hydrogen (H).

The second precursor 206 also includes a high carbon content. In some embodiments of the present invention, the ratio of C:Si in the second precursor 206 is greater than 3:1. According to other embodiments the ratio of C:Si in the second precursor 206 is about 4:1 to about 8:1. In one or more embodiments of the present invention, the second precursor 406 has a ratio of carbon to oxygen (C:O) is greater than 4:1. In other embodiments of the present invention, the second precursor 406 has a ratio of C:O is greater than 1.

According to one or more embodiments of the present invention, the second precursor 206 has the following structure:

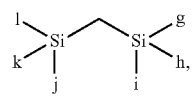

and
g, h, i, j, k, and l are each independently an alkyl group, an alkenyl group, or an alkoxyl group. The alkyl group is a methyl group, an ethyl group, a propyl group, a butyl group, or a pentyl group in some embodiments of the present invention. The alkenyl group is an ethenyl group, a propenyl group, a butenyl group, or a pentenyl group according to one or more embodiments of the present invention. The alkoxyl group is a methoxyl group, an ethoxyl group, a propoxyl group, or a butoxyl group according to some embodiments of the present invention.

According to one or more embodiments of the present invention, the second precursor 206 has the following structure:

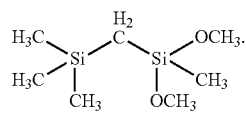

According to other embodiments of the present invention, the second precursor 206 has the following structure:

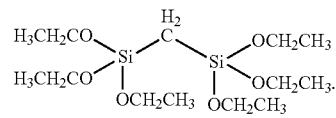

According to some embodiments of the present invention, the second precursor 206 has the following structure:

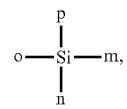

and
m, n, o, and p are each independently a hydrogen, an alkyl group, an alkenyl group, or an alkoxyl group. The alkyl group is a methyl group, an ethyl group, a propyl group, a butyl group, or a pentyl group in some embodiments of the present invention. The alkenyl group is an ethenyl group, a propenyl group, a butenyl group, or a pentenyl group according to one or more embodiments of the present invention. The alkoxyl group is a methoxyl group, an ethoxyl group, a propoxyl group, or a butoxyl group according to some embodiments of the present invention.

According to one or more embodiments of the present invention, the second precursor 206 has the following structure:

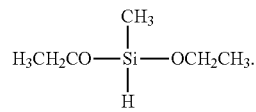

According to other embodiments of the present invention, the second precursor 206 has the following structure:

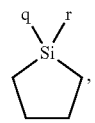

and
q and r are each independently a hydrogen, an alkyl group, an alkenyl group, or an alkoxyl group. The alkyl group is a methyl group, an ethyl group, a propyl group, a butyl group, or a pentyl group in some embodiments of the present invention. The alkenyl group is an ethenyl group, a propenyl group, a butenyl group, or a pentenyl group according to one or more embodiments of the present invention. The alkoxyl group is a methoxyl group, an ethoxyl group, a propoxyl group, or a butoxyl group according to some embodiments of the present invention.

According to one or more embodiments of the present invention, the second precursor 206 has the following structure:

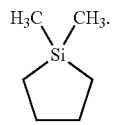

An oxidizing gas or an inert gas can be included in the chamber while the first precursor 204 and second precursor 206 are being deposited. Non-limiting examples of oxidizing gases include carbon dioxide, oxygen, nitrous oxide, or any combination thereof. The oxidizing gas can be used to stabilize the reactants in the reactor and to improve the uniformity of the dielectric film deposited on the substrate. The oxidizing gas is optional and can be used to facilitate reactivity and uniformity.

The conditions for depositing the first precursor 204 and second precursor 206 can vary depending on the desired final dielectric constant of the dielectric film. However, using a low temperature provides for a film with a high carbon-content by allowing for at least a portion of the labile organic porogen groups to remain in the final film. According to one or more embodiments of the present invention, the temperature used can be in a range from about 10 to about 300° C. In another aspect, the temperature can be set to a temperature in a range from about 25 to about 200° C. Yet, in other embodiments of the present invention, the temperature can be set to about 60 to about 120° C.

Figure 3:
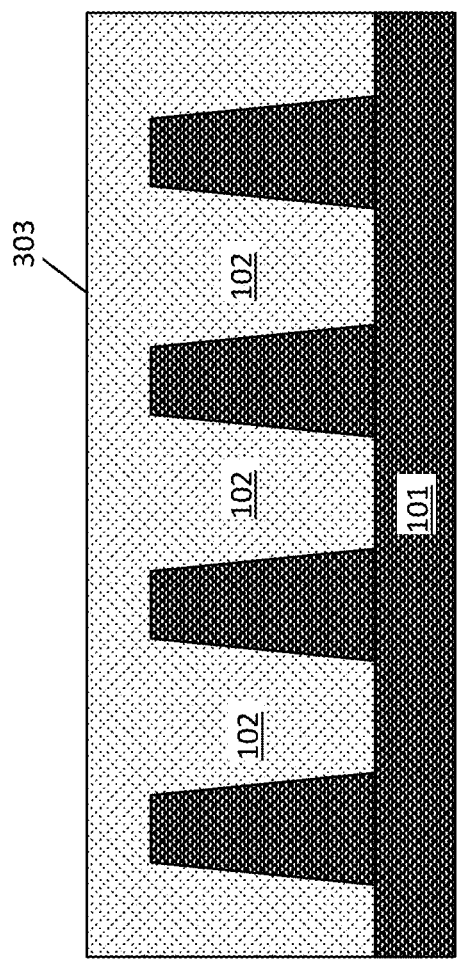

FIG. 3 depicts a cross-sectional side view of the patterned substrate 101 subsequent to forming the preliminary dielectric film 303 from the first and second precursors 204, 206 on the patterned substrate 101. The preliminary film 303 includes a covalently bonded network of silicon (Si), oxygen (O), carbon (C), and hydrogen (H), along with a cyclic carbosiloxane structure. The preliminary film 303 also includes a bridging Si—$CH_2$—Si group from the second precursor 206 according to some embodiments of the present invention.

The preliminary dielectric film 303 forms a conformal layer that is generally uniform on the surface of the patterned substrate 101. The preliminary dielectric film 303 fills the trenches 102, even with high aspect ratios, without forming air gaps or voids within.

The preliminary dielectric film 303 also includes a labile porogen, a portion of which will be subsequently removed to generate a porous final dielectric film. A porogen is a labile, removable functional group that is present in and covalently bonded to the preliminary film. At least a portion of the porogen is subsequently removed by an energetic treatment step (see FIG. 5) to provide the porous final low k film. As referred to herein, a porous dielectric film includes a plurality of pores or openings within the film formed from removal a plurality of labile porogens.

Figure 4:
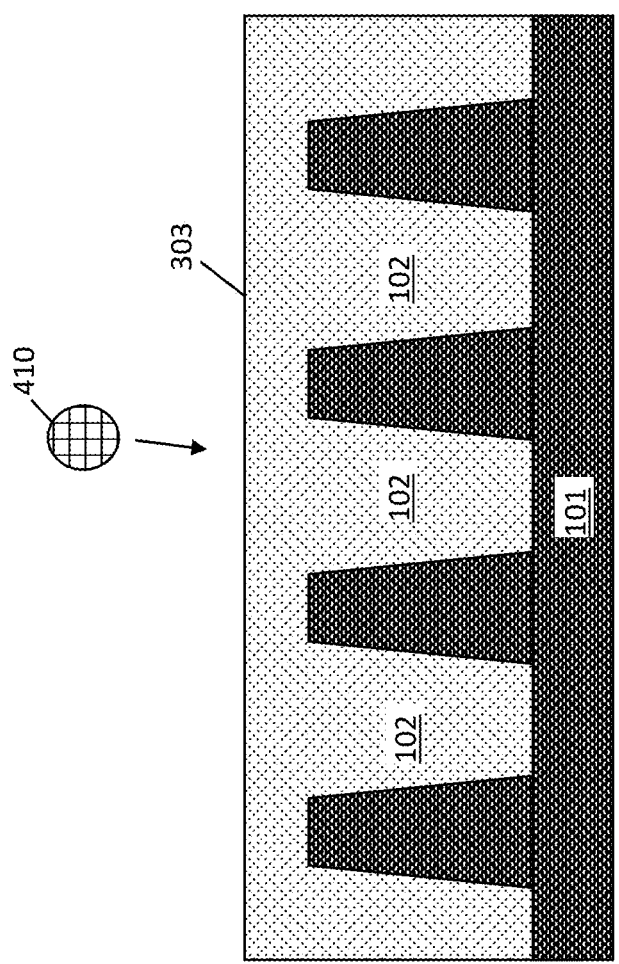

FIG. 4 depicts a cross-sectional side view of the patterned substrate 101 subsequent to exposing the preliminary dielectric film 303 to a nitrogen-containing precursor 410. The nitrogen-containing precursor 410 includes ammonia (NH3) according to one or more embodiments of the present invention. The nitrogen-containing precursor 410 includes dinitrogen monoxide ($N_2O$) according to some embodiments of the present invention.

Exposing the preliminary dielectric film 303 to the nitrogen-containing precursor 410 may or may not add a small amount of nitrogen (N) to the films. Thus, subsequent to exposure to the nitrogen-containing precursor 410, the resulting film includes silicon, carbon, oxygen, and hydrogen (SiCOH) or silicon, carbon, oxygen, hydrogen, and nitrogen (SiCONH). Exposing the preliminary film 303 to a nitrogen-containing precursor 410 mitigates film shrinkage and allows the film to retain more physical strength than an untreated otherwise-similar film. Without being bound by theory, exposure to the nitrogen-containing precursor 410 could increase the effectiveness of the subsequent curing process, which could remove undesirable components and cross-link the film matrix to establish a rigid material lattice.

Figure 5:
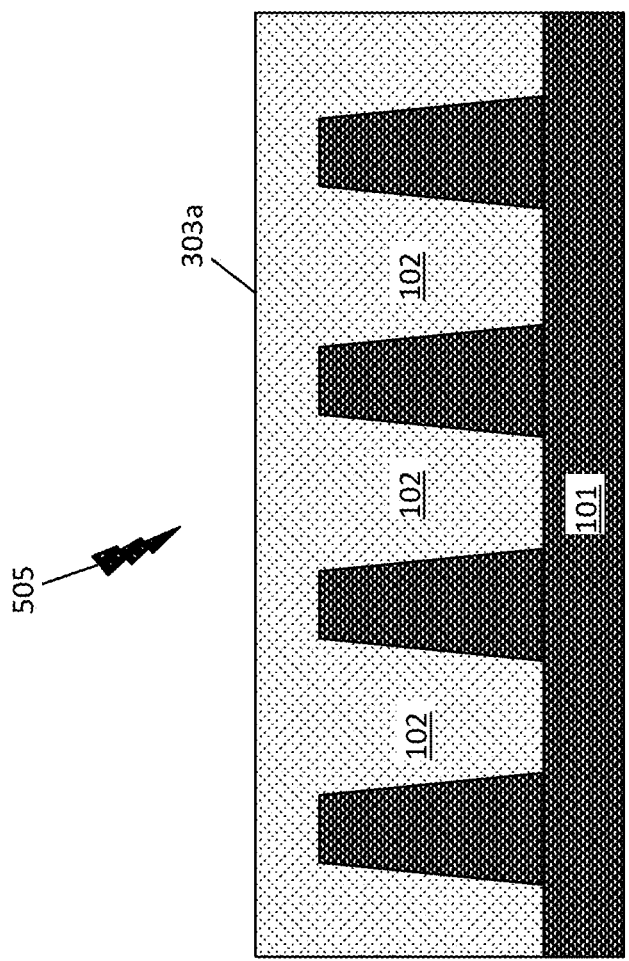
Figure 6:
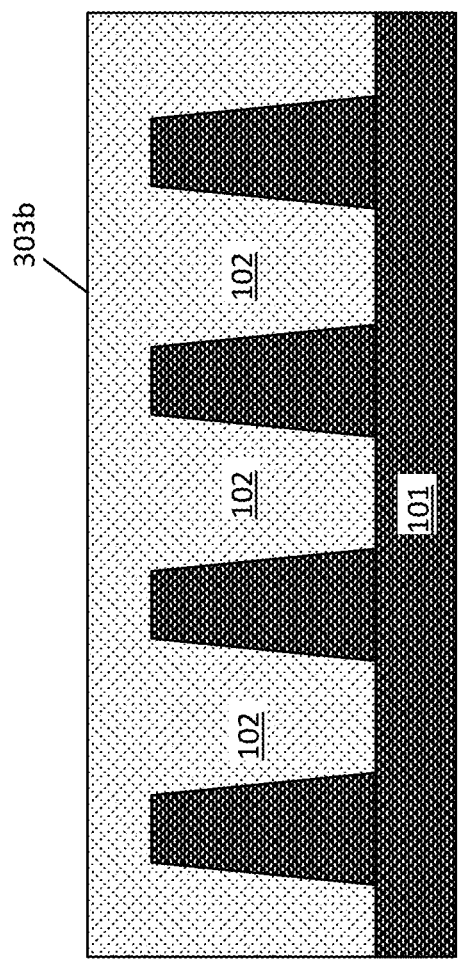

FIG. 5 depicts a cross-sectional side view of the nitrogen-treated preliminary dielectric film 303a during curing with an energy source 505. To form the porous final low k film (303b as shown in FIG. 6), energy 505 is applied to the nitrogen-treated preliminary dielectric film 303a in the form of thermal energy, UV light, microwave, electron beam, ion beam or other energy source, such as a catalytic species. In some embodiments of the present invention, a combination of two or more of these energy sources is employed. These energy input transforms the nitrogen-treated preliminary dielectric film 303a into the final porous low k film (as shown in FIG. 6). Specifically, removal of at least a portion of the labile porogen group from the preliminary film provides a porous film as described below. Because of the structure of the first precursor 204, with a cyclic carbosiloxane structure, smaller substantially non-interconnected pores are provided, for example compared to other cyclic tetrasilane precursors, e.g., octamethyl cyclotetrasilane (OMCTS). Also, because of the high carbon content of the second precursor, the carbon content of the final porous film is also higher.

According to some embodiments of the present invention, the temperature of the curing process is about 100 to about 450° C. According to other embodiments, the temperature of the curing process is about 200 to about 400° C. According to one or more embodiments of the present invention, the temperature of the curing process is about 250 to about 385° C., or about 300 to about 350° C.

At least a portion of the porogen is therefore not present in the final low k film 303b. The energetic treatment step creates pores, or voids or holes, in the final film. The resulting final low k film 303b has nanometer scale porosity that is formed by removal of the porogen groups.

The thickness of the low k film 303b generally varies and depends on the desired application. According to some embodiments of the present invention, the low k film 303b has a thickness of about 5 to about 500 nanometers (nm). In some embodiments of the present invention, the low k film 303b has a thickness of about 20 to about 120 nm.

According to one or more embodiments of the present invention, the dielectric constant (k) of the low k film 303b is less than 3.0. In some embodiments of the present invention, the k value of the low k film 303b is less than 2.7. Yet, in another aspect, the k value of the low k film 303b is less than about 2.6. Still yet, in another aspect, the k value of the low k film 303b is about 2.2 to about 2.8.

According to one or more embodiments of the present invention, the low k film 303b is a SiCOH film and has a covalently bonded network of atoms of Si, C, O, and H. The atoms form a tri-dimensional network structure in which Si, C, O, and H are interconnected and interrelated in the x, y and z directions. The low k film 303b includes a high percentage of carbon (C), which enhances cross-linking in the film. Further, a higher carbon content provides favorable properties, including lower plasma induced damage (PID), a smaller average pore size, and an improved modulus. In some embodiments of the present invention, the low k film 303b includes a bridging Si—CH$_2$—Si group.

In one or more embodiments of the present invention, the low k film 303b includes at least about 30 atomic percent (atomic %) carbon (C). In some embodiments of the present invention, the low k film 303b includes at least 35 atomic % carbon (C). Yet, in other embodiments of the present invention, the low k film 303b includes about 35 to about 50 atomic % carbon (C).

According to one or more embodiments, the low k film 303b is a SiCONH film and includes a small amount of nitrogen (N), which improves stability and PID. In some embodiments of the present invention, the low k film 303b includes about 1 to about 15 atomic % nitrogen (N). In other embodiments of the present invention, the low k film 303b includes about 1 to about 4 atomic % nitrogen (N).

The chemical structure of the low k film 303b enhances the mechanical properties of the material. According to one or more embodiments of the present invention, the low k film 303b has a modulus of 3 to about 12 gigapascals (GPa) at a 400 nm thickness. In some embodiments of the present invention, the low k film 303b has a modulus of about 7 to about 10 GPa at 400 nm.

According to one or more embodiments of the present invention, the low k film 303b has a porosity of about 1 to about 50%. According to some embodiments of the present invention, the low k film 303b has a porosity of about 8 to about 20%.

The low k films 303b can be used for a variety of applications. The films can be used, for example, in fully aligned via methods and devices, FEOL gate stack gap fill applications, and magnetic tunnel junction magnetoresistive random-access memory (MTJ MRAM) gap fill methods and devices.

EXAMPLES

Figure 7:
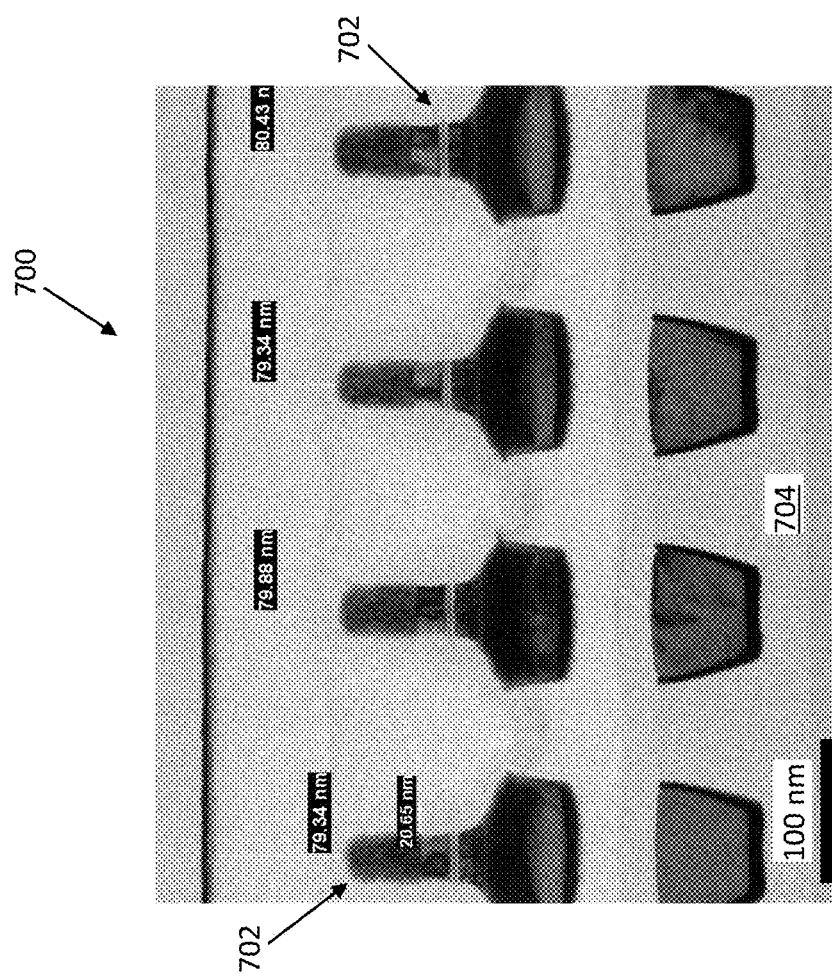
FIG. 7 depicts an exemplary electron micrograph image depicting a dielectric film arranged in trenches according to embodiments of the present invention.

FIG. 7 depicts an exemplary electron micrograph image 700 depicting a dielectric film 702 arranged in trenches of a substrate according to embodiments of the present invention. The film 702 was a SiCOH film and had a thickness of about 80 nm, with a k value of about 2.75. As shown, the film 702 filled the high aspect ratio gaps between pillars in the substrate 707. The gaps had an aspect ratio of 1:1. The film 702 filled the gaps without any indication of voids.

Figure 8:
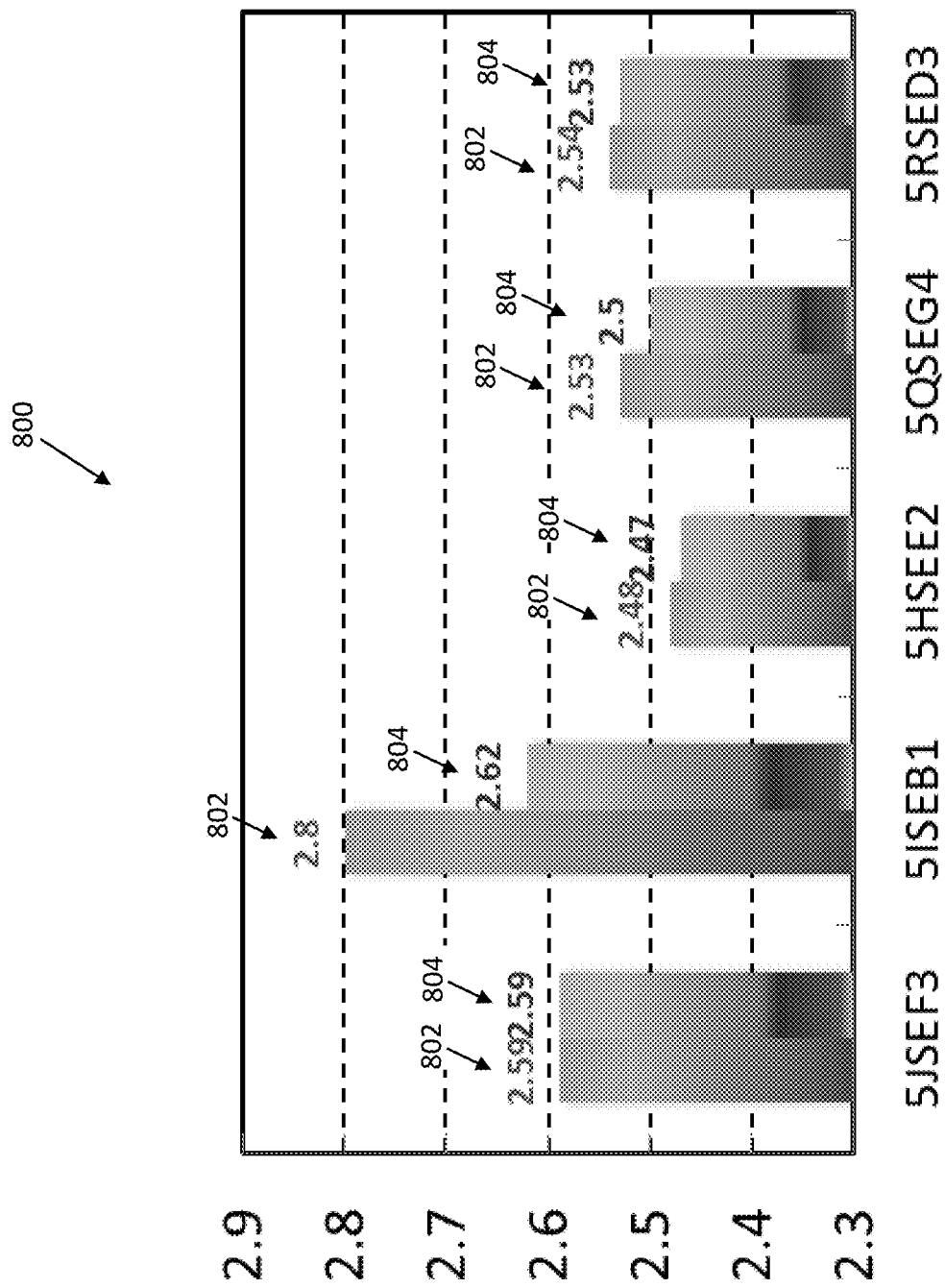
FIG. 8 depicts a graph comparing dielectric constants of dielectric films formed with and without ultraviolet (UV) light curing.

FIG. 8 depicts a graph 800 comparing dielectric constants of dielectric films formed with and without ultraviolet (UV) light curing. The measurements were conducted at 150° C. Generally, the dielectric films 802 without UV curing 802 had higher k values than dielectric films 804 that were UV cured 804. UV curing lowered the k values from about 2.8 to about 2.6.

Figure 9A:
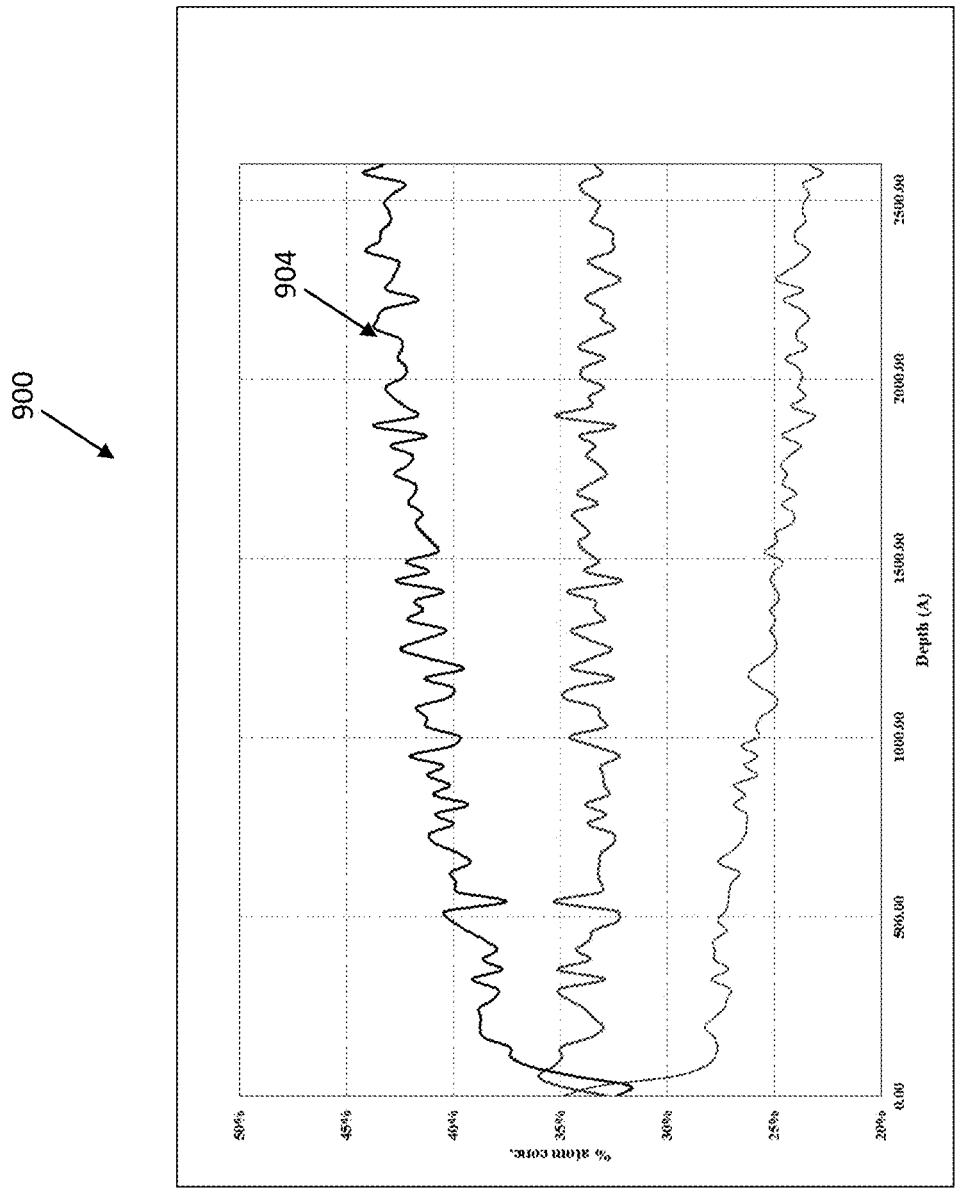
FIG. 9A depicts a graph showing atomic % carbon in a dielectric film according to embodiments of the present invention.
Figure 9B:
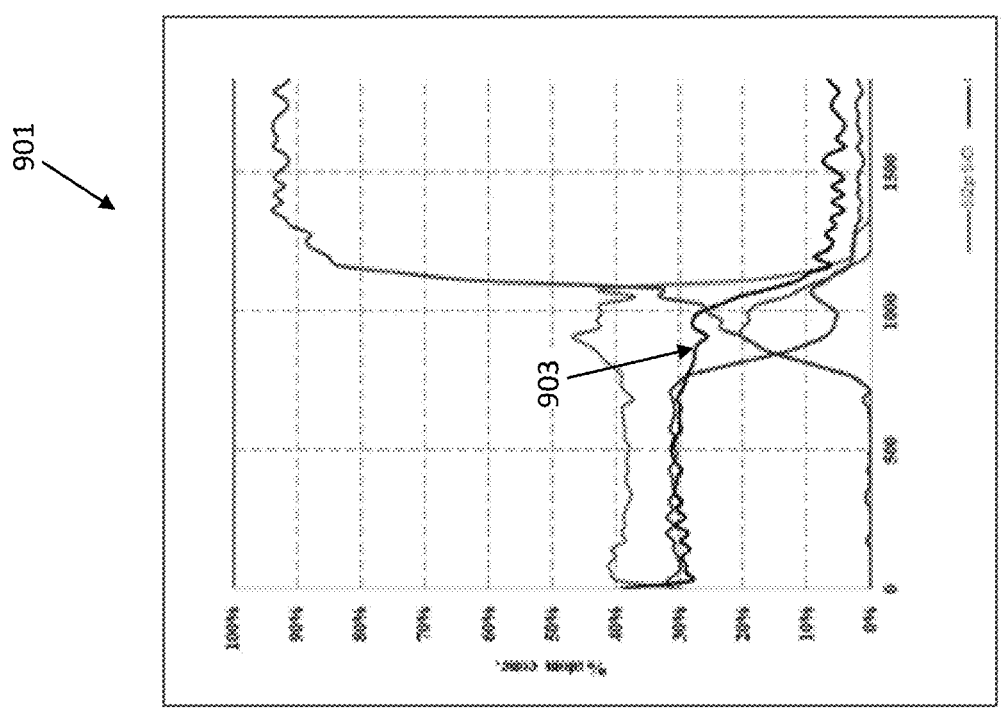
FIG. 9B depicts a graph showing atomic % carbon in comparative dielectric film.

FIG. 9A depicts a graph 900 showing atomic % (at. %) carbon in a film prepared according to embodiments of the present invention, which was formed from a cyclic carbosiloxane group precursor with a six-membered ring of silicon and oxygen. FIG. 9B depicts a graph 901 showing atomic % (at. %) carbon in a comparative dielectric film, which was formed from a octamethyl cyclotetrasilane (OMCTS) precursor that includes an eight-membered ring of silicon and oxygen. As shown in FIGS. 9A and 9B, the at. % carbon 904 of the inventive film was higher (40-45 at. %) (FIG. 9A) than the at. % carbon 903 of the comparative film, which was about 30 at. % (FIG. 9B).

Figure 10:
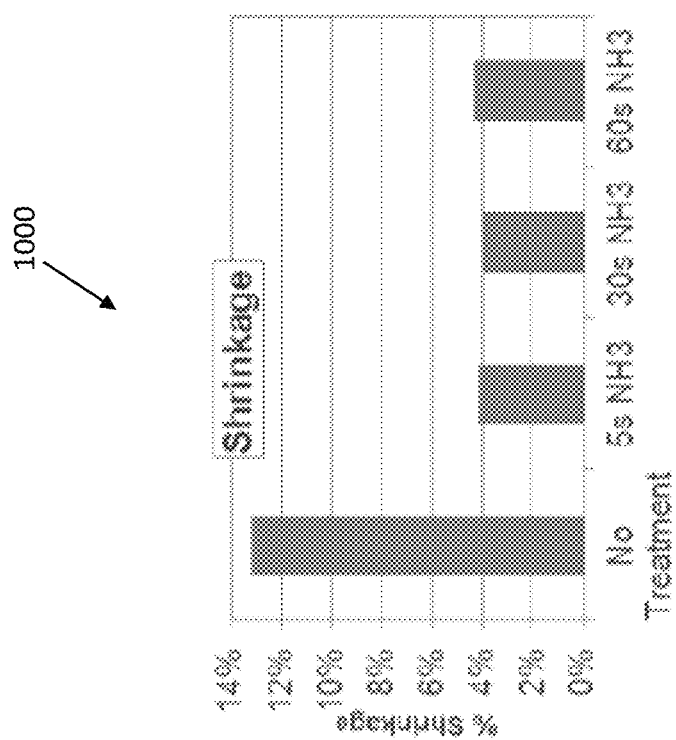
FIG. 10 depicts a graph showing % shrinkage of a dielectric film subsequent to ammonia exposure according to embodiments of the present invention.

FIG. 10 depicts a graph 1000 showing % shrinkage of a dielectric film subsequent to ammonia exposure according to embodiments of the present invention. As shown, treating the films with ammonia decreased the shrinkage of the films.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a dielectric film, the method comprising:
    depositing a first precursor on a substrate, the first precursor comprising a cyclic carbosiloxane group comprising a six-membered ring of three silicon atoms alternating with three oxygen atoms and having a carbon to silicon ratio (C:Si) greater than 2:1;
    depositing a second precursor on the substrate, the first precursor and the second precursor forming a preliminary film, and the second precursor comprising silicon, carbon, and hydrogen;
    exposing the preliminary film to ammonia to form a nitrogen-treated preliminary film; and
    curing, subsequent to exposing the preliminary film to ammonia, the nitrogen-treated preliminary film to form a porous dielectric film.

2. The method of claim 1, wherein the porous dielectric film comprises at least 30 atomic % carbon.

3. The method of claim 1, wherein the substrate is a patterned substrate, and the porous film is deposited in trenches within the patterned substrate.

4. The method of claim 1, wherein the porous dielectric film further comprises about 1 to about 4 atomic % nitrogen.

5. The method of claim 1, wherein the porous dielectric film has a k value of about 2.2 to about 2.8.

6. The method of claim 1, wherein the second precursor has the following structure:

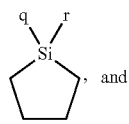, and q and r are each independently a hydrogen, an alkyl group, an alkenyl group, or an alkoxyl group.

7. The method of claim 1, wherein the second precursor has the following structure:

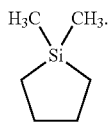

8. The method of claim 1, wherein the second precursor is a cyclic carbosiloxane.

9. A method of fabricating a dielectric film, the method comprising:
- depositing a first precursor on a substrate, the first precursor comprising a cyclic carbosiloxane group comprising a six-membered ring of three silicon atoms alternating with three oxygen atoms and having a carbon to silicon ratio (C:Si) greater than 2:1;
- depositing a second precursor on the substrate, the first precursor and the second precursor forming a preliminary film on the substrate, and the second precursor comprising a carbosilane with a carbon to silicon ratio greater than 3:1; and
- curing the preliminary film to form a porous dielectric film.

10. The method of claim 9 further comprising exposing the preliminary film to a nitrogen-containing precursor.

11. The method of claim 9, wherein the porous dielectric film comprises at least 30 atomic % carbon.

12. The method of claim 9, wherein the carbon to silicon ratio in the second precursor is greater than 4:1.

13. The method of claim 9, wherein the curing includes exposing the preliminary film to thermal energy, ultraviolet light, microwave energy, electron beam energy, ion beam energy, or a catalytic species.

14. The method of claim 9, wherein the carbosilane has the following structure:

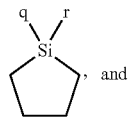, and q and r are each independently a hydrogen, an alkyl group, an alkenyl group, or an alkoxyl group.

* * * * *